US007982497B1

(12) United States Patent
Trimberger

(10) Patent No.: US 7,982,497 B1
(45) Date of Patent: Jul. 19, 2011

(54) MULTIPLEXER-BASED INTERCONNECTION NETWORK

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/819,900

(22) Filed: Jun. 21, 2010

(51) Int. Cl.
*H01L 25/00* (2006.01)

(52) U.S. Cl. .............................. 326/41; 326/47; 326/101

(58) Field of Classification Search .............. 326/37–41, 326/47, 101
See application file for complete search history.

(56) References Cited

U.S. PATENT DOCUMENTS

| | | | |
|---|---|---|---|
| 6,018,523 A | 1/2000 | Even | |
| 6,370,140 B1* | 4/2002 | Nayak | 370/386 |
| 6,693,456 B2 | 2/2004 | Wong | |
| 6,940,308 B2 | 9/2005 | Wong | |
| 6,982,974 B1 | 1/2006 | Saleh et al. | |
| 7,028,281 B1* | 4/2006 | Agrawal et al. | 326/41 |
| 7,242,216 B1* | 7/2007 | Schmit et al. | 326/39 |
| 7,285,487 B2 | 10/2007 | DeHon et al. | |
| 2002/0113619 A1* | 8/2002 | Wong | 326/41 |
| 2003/0043842 A1 | 3/2003 | Tran | |
| 2004/0150422 A1* | 8/2004 | Wong | 326/41 |
| 2005/0218928 A1* | 10/2005 | Pani et al. | 326/41 |
| 2006/0006906 A1* | 1/2006 | Pani et al. | 326/41 |
| 2007/0268041 A1* | 11/2007 | Pani et al. | 326/41 |
| 2008/0272806 A1* | 11/2008 | Pani et al. | 326/41 |
| 2009/0273368 A1* | 11/2009 | Pani et al. | 326/41 |
| 2010/0244895 A1* | 9/2010 | Pani et al. | 326/41 |

FOREIGN PATENT DOCUMENTS

| | | |
|---|---|---|
| WO | WO 2008/109756 A1 | 9/2008 |
| WO | WO 2008/147926 A1 | 12/2008 |
| WO | WO 2008/147927 A1 | 12/2008 |
| WO | WO 2008/147928 A1 | 12/2008 |

OTHER PUBLICATIONS

U.S. Appl. No. 12/819,903, filed Jun. 21, 2010, Trimberger.
U.S. Appl. No. 12/819,953, filed Jun. 21, 2010, Trimberger.
Bertacco, V. et al., *Decision Diagrams and Pass Transistor Logic Synthesis*, Technical Report No. CSL-TR-97-748, Dec. 1997, pp. 1-12, Stanford University, Computer Systems Laboratory, Stanford, California, USA.
Mehrotra, Rakesh et al., "Comparison between nMOS Pass Transistor Logic style vs. CMOS Complementary Cells," *Proc. of the 1997 IEEE Conference on Computer Design (ICCD '97)*, Oct. 12, 1997, pp. 1-6, IEEE Computer Society, Los Alamitos, California, USA.
Newman, Peter, *Fast Packet Switching for Integrated Services*, Dec. 1988, Wolfson College, University of Cambridge Computer Laboratory, Cambridge, United Kingdom.

\* cited by examiner

*Primary Examiner* — Rexford N Barnie
*Assistant Examiner* — Thienvu V Tran
(74) *Attorney, Agent, or Firm* — LeRoy D. Maunu; Lois D. Cartier

(57) ABSTRACT

The logical functionality of a non-blocking multiplexer-based network is equivalent to a crossbar network with an ingress stage, a middle stage and an egress stage. Crossbar rows of the crossbar network include both outbound and inbound internal connections between other crossbar rows. The multiplexer-based network has corresponding rows and connections. The multiplexer-based network includes rows with an internal multiplexer for each respective outbound internal connection of a corresponding crossbar row. The internal multiplexer includes inputs for signals routable to the respective outbound internal connection. At least one global multiplexer provides a signal selected from a set of inputs that includes each input of the respective crossbar row.

7 Claims, 7 Drawing Sheets

MULTIPLEXER-BASED INTERCONNECTION NETWORK

FIELD OF THE INVENTION

The present invention generally relates to interconnection networks, and more particularly, to multiplexer-based interconnection networks.

BACKGROUND

Programmable logic devices (PLDs) are a type of programmable integrated circuit (IC) that can be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The programmable interconnect structure (also referred to as a routing fabric) typically includes conductors of various lengths interconnected by programmable switches (referred to as programmable routing resources). For example, some types of conductors may span two CLBs (referred to as doubles), while other types of conductors may span six CLBs (referred to as hexes). The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

For many FGPA designs it is desirable that the interconnection network allow for a robust set of routing solutions. For instance, the interconnection network can be strict-sense or rearrangeably non-blocking. The technology behind FPGAs, however, is ever-changing and the interconnection network designs have not kept pace. Moreover, many commonly-used interconnection network types have been studied for their efficacy relative to systems other than FPGAs. In general, these networks tend to be expensive in terms of size and delay for the restricted interconnection problem posed for FPGAs. Thus, many interconnection networks are not necessarily well-suited for use in FPGA designs.

The present invention may address one or more of the above issues.

SUMMARY

According to an example embodiment, a non-blocking interconnection network is provided having a plurality of global inputs, a plurality of global outputs and a plurality of routing circuits that collectively couple the plurality of inputs to the plurality of outputs in a non-blocking manner. Each routing circuit includes a first multiplexer including a first set of inputs and a first internal output. The first set of inputs is coupled to two global inputs of the plurality of global inputs.

The first multiplexer is configured to provide a selected input of the first set of inputs to the first output in response to a first selection input. A second multiplexer includes a second set of inputs and a second internal output. The second set of inputs is coupled to the two global inputs of the plurality of global inputs and to a second internal output from a first other one of the routing circuits. The second multiplexer is configured to provide a second selected input of the second set of inputs to the second output in response to a second selection input. A third multiplexer includes a third set of inputs and a first global output. The third set of inputs is coupled to the two global inputs of the plurality of global inputs, to the second internal output from the first other routing circuit, and to a second internal output from a second other one of the routing circuits. The second multiplexer is configured to provide a third selected input of the third set of inputs to the first global output in response to a third selection input. A fourth multiplexer is coupled to the third set of inputs and includes a second global output. The fourth multiplexer is configured to provide a fourth selected input of the third set of inputs to the second global output in response to a fourth selection input.

In various implementations, the non-blocking interconnection network can further include additional routing circuits. The third set of inputs can be coupled to a local output from each of the additional routing circuits.

In certain embodiments, the non-blocking interconnection can also include a plurality of rows, each row corresponding to a respective routing circuit. The third set of inputs can be coupled to at least one local output from another of the plurality of rows.

In one embodiment, the non-blocking interconnection network can also include a plurality of rows, each row corresponding to a respective routing circuit. The third set of inputs can include all inputs to the respective row.

In certain embodiments, the plurality of routing circuits of the non-blocking interconnection network can collectively provide equivalent functionality to a Benes network.

For various embodiments, the non-blocking can also be coupled to inputs and outputs of configurable logic blocks of a programmable integrated circuit. Each of the multiplexers for a particular row can be co-located near a configurable logic block.

In certain implementations, the non-blocking interconnection network can be rearrangeably non-blocking.

In another embodiment, a multiplexer-based network provides the routing equivalent to a non-blocking crossbar network that has a plurality of crossbar switches making up an ingress stage, a middle stage and an egress stage. The non-blocking crossbar network includes a plurality of crossbar rows, each crossbar row including outbound and inbound internal connections to another crossbar row. The multiplexer-based network includes a plurality of multiplexer-based network rows. Each multiplexer-based network row of the plurality of multiplexer-based network rows corresponds to a crossbar row of the crossbar network and includes at least one global input, at least one global output, a plurality of internal inputs, a plurality of internal outputs, and a corresponding set of multiplexers. Each set of multiplexers includes an internal multiplexer for each respective outbound internal connection of the respective crossbar row. The internal multiplexer includes inputs for signals routable to the respective outbound internal connection. At least one global multiplexer provides a signal to a global output of the multiplexer-based network row. The global multiplexer includes a set of inputs that includes each input of the respective crossbar row.

In certain embodiments, the non-blocking crossbar network is a Benes network.

In various embodiments, each crossbar row of the non-blocking crossbar network has at least five stages and wherein each stage has an input and output.

Consistent with one embodiment, each crossbar row of the non-blocking crossbar network has N stages, N being an integer, and the set of multiplexers includes multiplexers having increasing sizes from 2:1 to N:1.

In various embodiments, the multiplexer-based network can also be coupled to inputs and outputs of configurable logic blocks of a programmable integrated circuit. Each multiplexer corresponding to a particular crossbar row can be co-located near a configurable logic block.

In a particular embodiment, the multiplexer-based network is rearrangeably non-blocking.

Commensurate with a further embodiment, a programmable integrated circuit includes a plurality of programmable logic blocks and a configurable interconnection network. The configurable interconnection network connects the plurality of programmable logic blocks. The configurable interconnection network is configured to provide routing equivalent to a non-blocking network that has a plurality of rows. Each row has a plurality of switch-levels that are coupled to other rows by internal connections. The configurable interconnection network includes a plurality of multiplexer-based network rows. Each multiplexer-based network row of the plurality of multiplexer-based network rows corresponds to a crossbar row of the crossbar network and includes at least one global input, at least one global output, a plurality of internal inputs, a plurality of internal outputs, and a corresponding set of multiplexers. Each set of multiplexers includes an internal multiplexer for each respective outbound internal connection of the respective crossbar row. The internal multiplexer includes inputs for signals routable to the respective outbound internal connection. At least one global multiplexer provides a signal to a global output of the multiplexer-based network row. The global multiplexer includes a set of inputs that includes each input of the respective crossbar row.

Consistent with one embodiment, each block of the plurality of programmable logic blocks can include a plurality of look-up-tables having at least four inputs.

In various implementations, the non-blocking crossbar network is a Benes network.

Consistent with an embodiment, each logic block of the plurality of programmable logic blocks includes at least 16 inputs and four outputs.

Consistent with an embodiment, each row of the non-blocking crossbar network has N stages and the corresponding set of multiplexers include multiplexers having increasing sizes from 2:1 to N:1.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
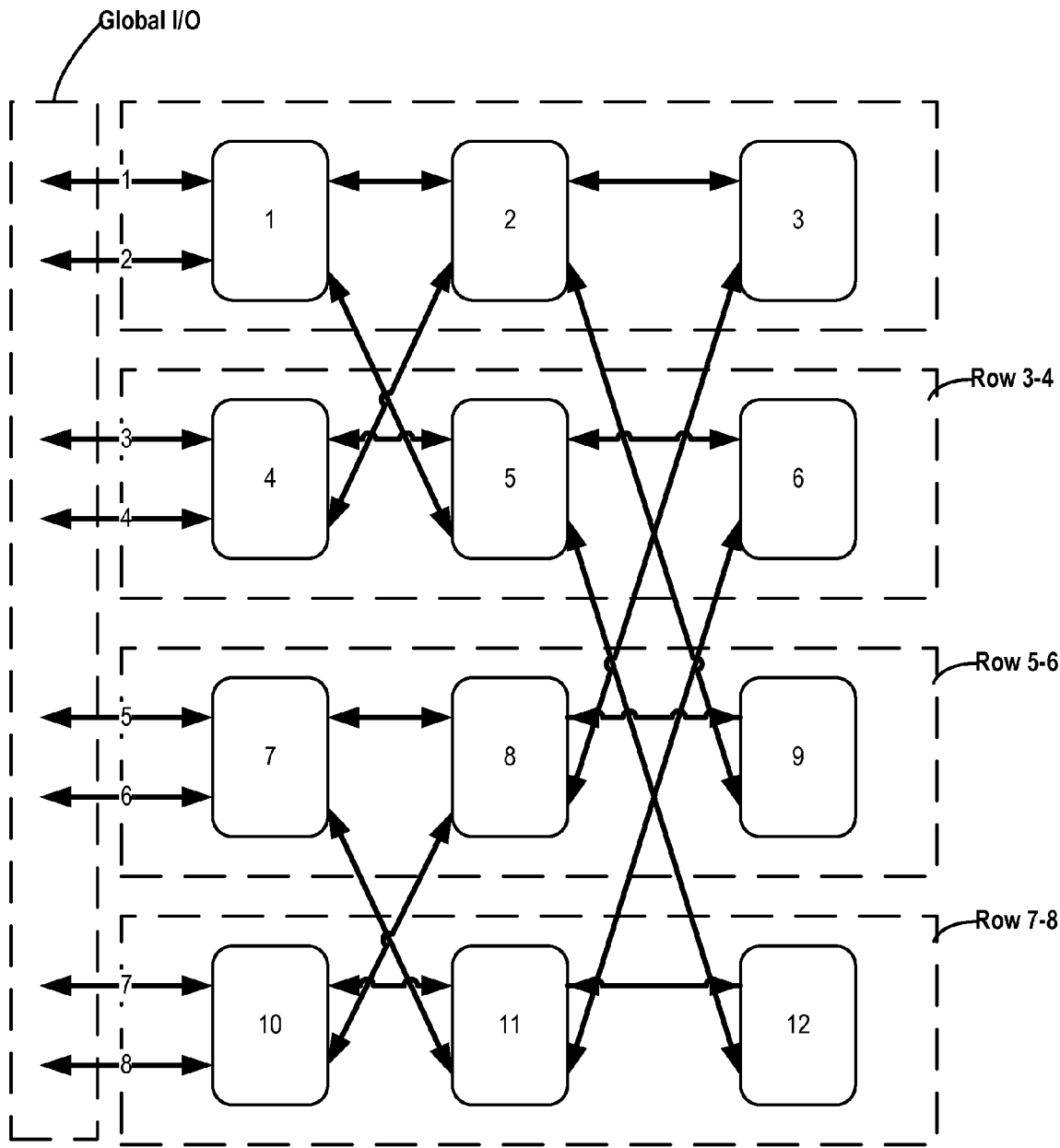
FIG. 1 depicts a logical diagram for an interconnection network.

The various embodiments described herein provide an interconnection network within an integrated circuit (IC) package. The interconnection network is implemented using a set of multiplexers that is designed to provide the functional equivalent to a crossbar switch-based network. The use of multiplexers as the primary switching control elements can be useful for reducing the propagation time of signals through the network while also providing improvements in wire lengths.

Many interconnection networks use multistage interconnection networks. Such multistage networks can include three stages of switches: ingress switches, middle switches, and egress switches. The ingress switches receive global/external signals as inputs and provide these global signals to the middle switches using internal connections. The middle switches receive and transmit signals on such internal connections. Egress switches receive signals from internal connections from the middle switches and transmit the signals to global outputs. A multi-stage network may be hierarchical in that one stage of switching is itself a multi-stage network.

As used herein and unless otherwise stated, a non-blocking network can be either a strict-sense or rearrangeably non-blocking network. Non-limiting examples of multistage interconnection network types include Clos, Benes, Banyan, Omega and Delta. A Clos network can be either a strict-sense or rearrangeably non-blocking network. A Benes network is a rearrangeably non-blocking network that can include many internal/middle stages. A Benes network may be extended to be non-blocking for multi-cast signals.

Examples discussed herein refer to embodiments that are discussed in relation to one or more particular network types; however, embodiments of the present invention are not so limited. For instance, the various embodiments that are premised upon aspects of particular networks, such as Benes networks, can be generalized to allow for various other types of networks to be used. Moreover, relatively minor variations can be made to the particular network types. This can include modifying a few inputs, outputs, switches or connections, whilst the majority of the network remains the same. In this manner, the resulting network might not be 100 percent non-blocking; however, such minor changes are often largely immaterial, e.g., when the network remains very close to being non-blocking despite the modifications.

Particular aspects of the present disclosure discuss embodiments in relation to network rows. The term network row generally refers to a set of switches that a signal traverses in order to be routed between an input and an output. Each network row contains a set of switches that are non-overlapping (no switch resides in two different rows) with respect to the switches of each of the other network rows. As used herein an internal input or output refers to a connection between rows of a network, and a global input or output refers to a connection that leaves the network.

In many FPGA designs the routing fabric allows for bi-directional routing to and from each logic block. Although not necessarily limited thereto, one or more embodiments select the rows by following a path that a signal traverses in order to be routed to and from the same logic block. This can be particularly useful for physical and/or logical design or placement of row components according to the logic block input and output that defines the particular row. For instance, the components of a row can be located near the logic block corresponding to the input and output signals for the logic block, i.e., located physically proximate to a particular logic block relative to the other logic blocks of the FPGA.

Signals originating from components outside the interconnection network are referred to as global input signals. Signals that are provided to components outside of the interconnection network are referred to as global output signals. The ingress stage components and egress stage components of the interconnection network have corresponding global inputs and outputs, respectively. Middle stage components of the interconnection network receive internal inputs and provide internal outputs. The inputs can be coupled to components within the same row or to components in another row.

The described embodiments are directed toward implementations of interconnection networks that provide the functionality of a multistage interconnection network using nontraditional multiplexer components. As discussed in more detail herein, the nontraditional multiplexer components can be implemented using wide multiplexers. The nontraditional interconnection network, however, can include multiplexers of varying widths. The widths of these multiplexers can vary according to the number of stages in the multistage interconnection network for which the nontraditional network provides similar or equivalent functionality.

Turning now to the figures, FIG. 1 depicts a logical diagram for an interconnection network. The particular interconnection network depicted is consistent with an 8-input, 8-output, 3-stage folded Benes network that is implemented using a plurality of 2×2 crossbar switch elements. Each stage in the network is shown in a column. As explained in more detail hereafter, however, embodiments are implemented using relatively wide multiplexers.

The diagram of FIG. 1 is a folded network in so much as each signal path (arrowed connectors) represents a bidirectional logic path for signals to traverse. Thus, the logic diagram of FIG. 1 could be depicted as a non-folded network with unidirectional arrows by essentially duplicating the various switch components (1-2, 4-5, 7-8 and 10-11), producing a five-stage network. Instead, the diagram of FIG. 1 depicts the network as being folded along the middle stage of switches (3, 6, 9 and 12). The duplicated switch components of the folded network provide the functionality of two switch components, one in each signal direction. Network designs that implement individual switches for each switch can still co-locate the folded switches due to the similarities caused by the symmetry of the network design. Global input signals received in input ports 1-8 are received and routed to global output ports 1-8 according to a desired routing solution. In particular implementations, the interconnection network is rearrangeably non-blocking by virtue of the functionality provided by switch components 1-12 and the connection pattern among them. The diagram of FIG. 1 shows 8 global input/output ports, but is easily scalable to a relatively large number of global ports.

The functionality of the logic diagram of FIG. 1 can be implemented using a number of small switches (e.g., 2×2 crossbar switches). While systems that use relays or optical switches might find such an implementation viable or even preferred, such implementations can be less than ideal for other applications, such as programmable ICs. One potential issue relates the signal delays caused by traversal of a large number of switch components. For the 8 global ports shown, the number of stages a signal traverses is at least 5. For instance, a signal that is routed from global input port 1 to global output port 6 could traverse the switch components 1→5→12→11→7. As the number of global ports grows, the number of switch components that need to be traversed increases accordingly. Moreover, implementations that use 2×2 crossbar switches as the primary switching components require a significant number of crossbar switches. In some interconnection networks, global outputs may be registered. That is, the output of the switch component may be stored and transmitted to the next stage at a subsequent clock period. Although these registers are not shown in the figures, many of the various embodiments, structures, and methods described herein apply to both registered and non-registered networks.

The described embodiments can be particularly useful for providing equivalent functionality to various network types while providing a low number of switching components that must be traversed and/or limiting the total number of switching components in the interconnection network. Particular implementations recognize that use of multiplexer-based logic allows for signal-routing paths to be significantly shortened relative to the number of switch components traversed and/or the wire length of the signals. For instance, a signal routed from a physical location back to an input near the same physical location can be implemented by providing a (relatively wide) multiplexer that effectively bypasses the logical levels between the input and output. Further details on such multiplexer-based configurations are provided herein.

Figure 2:
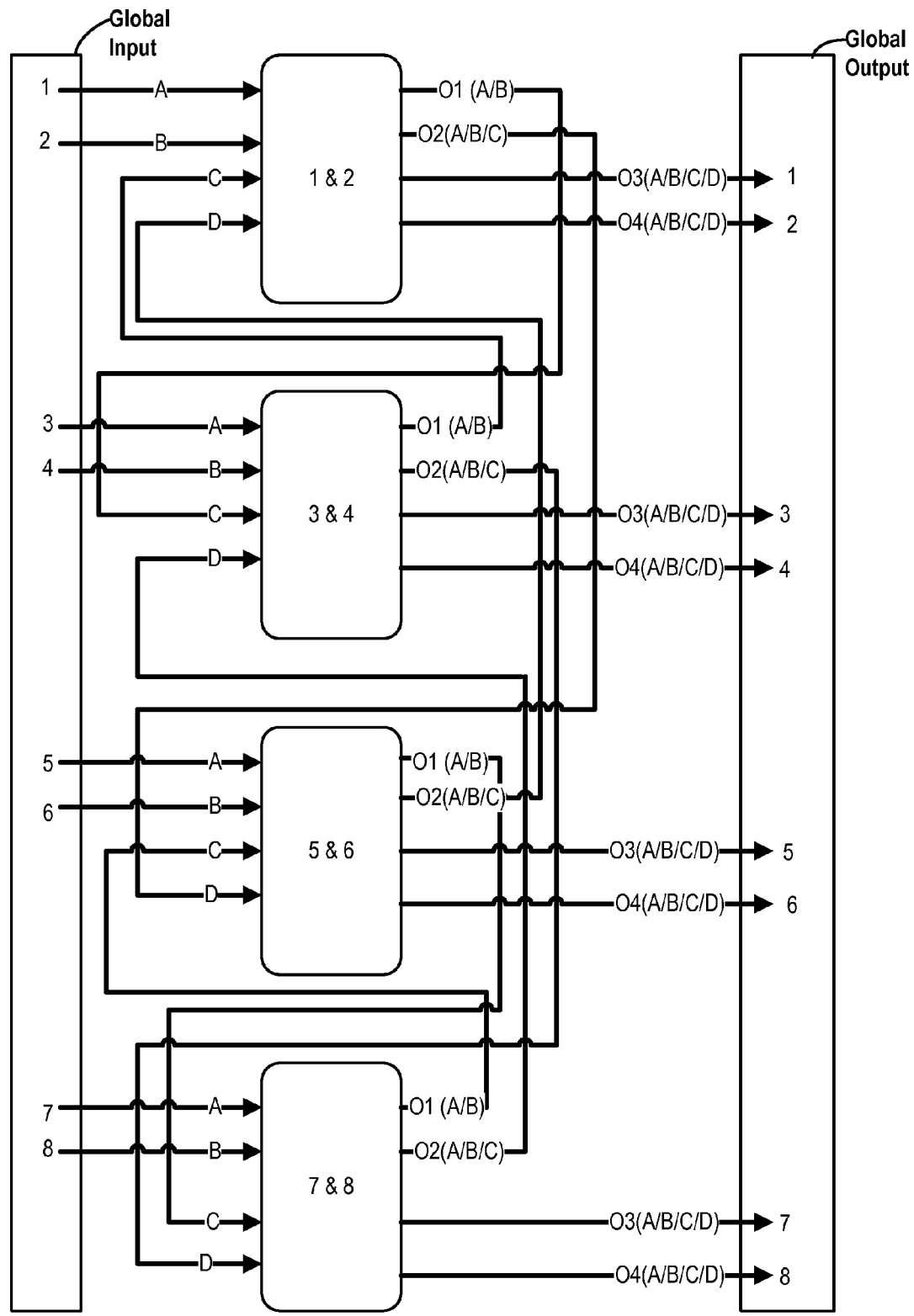
FIG. 2 depicts a logical diagram depicting global and internal signal routing for an interconnection network.

FIG. 2 depicts a logical diagram depicting global and internal signal routing for an interconnection network. The logical diagram of FIG. 2 represents the logical routing of signals in a 4×4 Benes network. Each block (1&2 and 3&4) represents an entire row. There are 4 different internal connections between the different rows. Thus, there are 2 internal inputs and 2 internal outputs for each row. FIG. 2 depicts these 4 internal inputs as C and D and the internal outputs as O1 and O2 for each respective row. Each row also contains two global inputs and two global outputs, which correspond to inputs A and B and outputs O3 and O4 of each row, respectively.

The potential mapping of the outputs of each row (O1-O4) relative to the inputs of each row (A-D) is depicted within the parenthetical for each output. Thus, output O1 can be either A or B; output O2 can be either A, B or C and outputs O3 and O4 can be either A, B, C or D. Outputs O1 and O2 are routed to inputs A or B in the other row as depicted. These potential mappings are derived from the corresponding possible routings of a Benes network. In this manner, the depicted network is rearrangeably non-blocking. It should be noted that network types other than a Benes network can be represented in a similar manner and/or minor modifications can be made thereto. For instance, various butterfly networks or mesh networks can be represented according to groupings of logical switch elements and the corresponding possible signal routings on each internal and global connection of the network.

For a particular routing solution, each signal path is set to carry a particular signal of the potential signals listed. In an example use of the interconnection network, global input 3 may be mapped to global output 2. A signal from global input 3 will first be received at row 3&4 at input A. Row 3&4 has the capability of routing a signal on input A to any of outputs O1-O4. One path from global input 3 to global output 2 would include routing the signal from input A to output O2 of row 3&4. Output O2 of row 3&4 is received as input D of row 1&2. From here the signal can be routed directly to output O4 of row 1&2, which is directly connected to global output 2.

While FIG. 2 depicts the logical equivalence to a Benes network, a similar row-based logical diagram can be constructed for a number of other network types. Moreover, the logical diagram can be scaled for virtually any size network and can be implemented for variations of traditional network types. For instance, minor changes to the network types (e.g., the addition or removal of a few nodes or connections) can still be represented by a similar diagram.

Advantages of implementing the switching aspects of the interconnection network using wide multiplexers can be more easily seen when considering larger Benes networks. As the size of a Benes network increases, the stages in the network also increase in number. For some implementations, an increased number of stages can result in increased amount of logic, longer wire lengths and higher delay times.

The significance of the logical diagram of FIG. 2 may not be immediately apparent. The described embodiments, however, use particular configurations of multiplexers to provide the routing functionality of FIG. 2. In specific embodiments, any signal routing through a particular row traverses only a single switching component (e.g., a single multiplexer). This can be particularly useful for providing reduced latency caused by long wire lengths and/or the traversal of numerous switching components. These aspects are particularly well-suited for many modern programmable IC devices.

Figure 3:
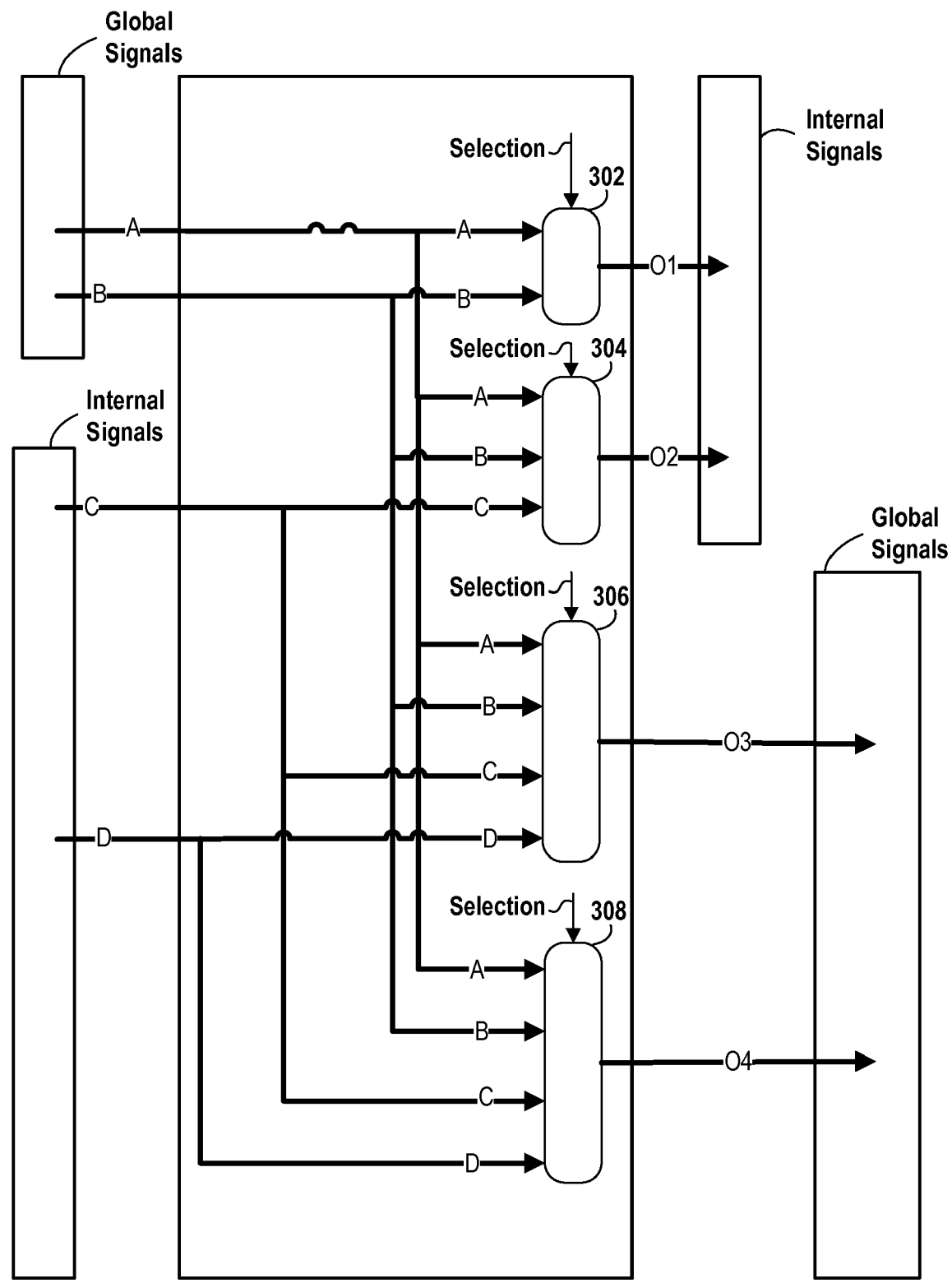
FIG. 3 depicts a set of multiplexers providing the functionality of one row from FIG. 2.

FIG. 3 depicts a set of multiplexers providing the functionality of one row from FIG. 2. Consistent with FIG. 2, each row receives two internal input signals (C&D) and two global input signals (A&B). Each row also provides two internal output signals (O1 & O2) and two global output signals (O3 & O4). Multiplexers 302-308 provide the routing functionality depicted in FIGS. 1 and 2. Selection signals control the outputs of each individual multiplexer.

The particular configuration of multiplexers and signal connections depicted in FIG. 3 represents a logical equivalent of a row taken from a Benes network. Each multiplexer is configured to correspond to an output from the Benes row by receiving, as inputs, each possible signal for the output. Thus, the individual switching components of the traditional Benes network are replaced by a flat set of multiplexers. The flat set of multiplexers is smaller in number than the number of switching elements in an traditional Benes network, and since signals can traverse one of the flat multiplexers instead of several of the Benes switching elements in series, signals reach their destinations with less delay.

The particular configuration is scalable according to the size of the Benes network. To conceptualize how larger networks would be implemented, the multiplexers can be broken into two different groups. The first group of multiplexers provides global outputs and the second group of multiplexers provides internal outputs. As used herein, an internal output is an output that is received by another row as an input, whereas a global output is an output that leaves the interconnection network.

It can be shown that, for a Benes network, any input (whether internal or global) of a particular row can be routed to either of the global outputs of the same row. Accordingly, the global (output) multiplexers of a Benes network-based solution are designed to be able to provide any input as an output. In FIG. 3 this means that each of output O3 and O4 can provide any of inputs A, B, C or D. As the size of the network increases, the number of stages increases. As the number of stages increases, the number of internal inputs for each row also increases. Accordingly, the output multiplexers increase in size to allow any of the inputs to be routed to the global outputs.

The internal (output) multiplexers provide outputs that correspond to various different stages of a Benes networks. As such the number of internal multiplexers increases as the number of stages increases. Moreover, the number of possible signals provided at each internal output increases for each successive stage of a Benes network. For instance, internal multiplexer 302 is a 2 to 1 multiplexer that is capable of providing either signal A or B as an output. Internal multiplexer 304 represents an output for a successive stage in a Benes network and is therefore a 3 to 1 multiplexer that is capable of providing any one of signals A, B or C as an output. Thus, as the number of stages increases the size of each additional multiplexer also increases accordingly. This increasing size of multiplexers is not necessarily limited to Benes type networks, and regardless, the particular configuration can be modified to be consistent with network types other than a Benes network.

Figure 4:
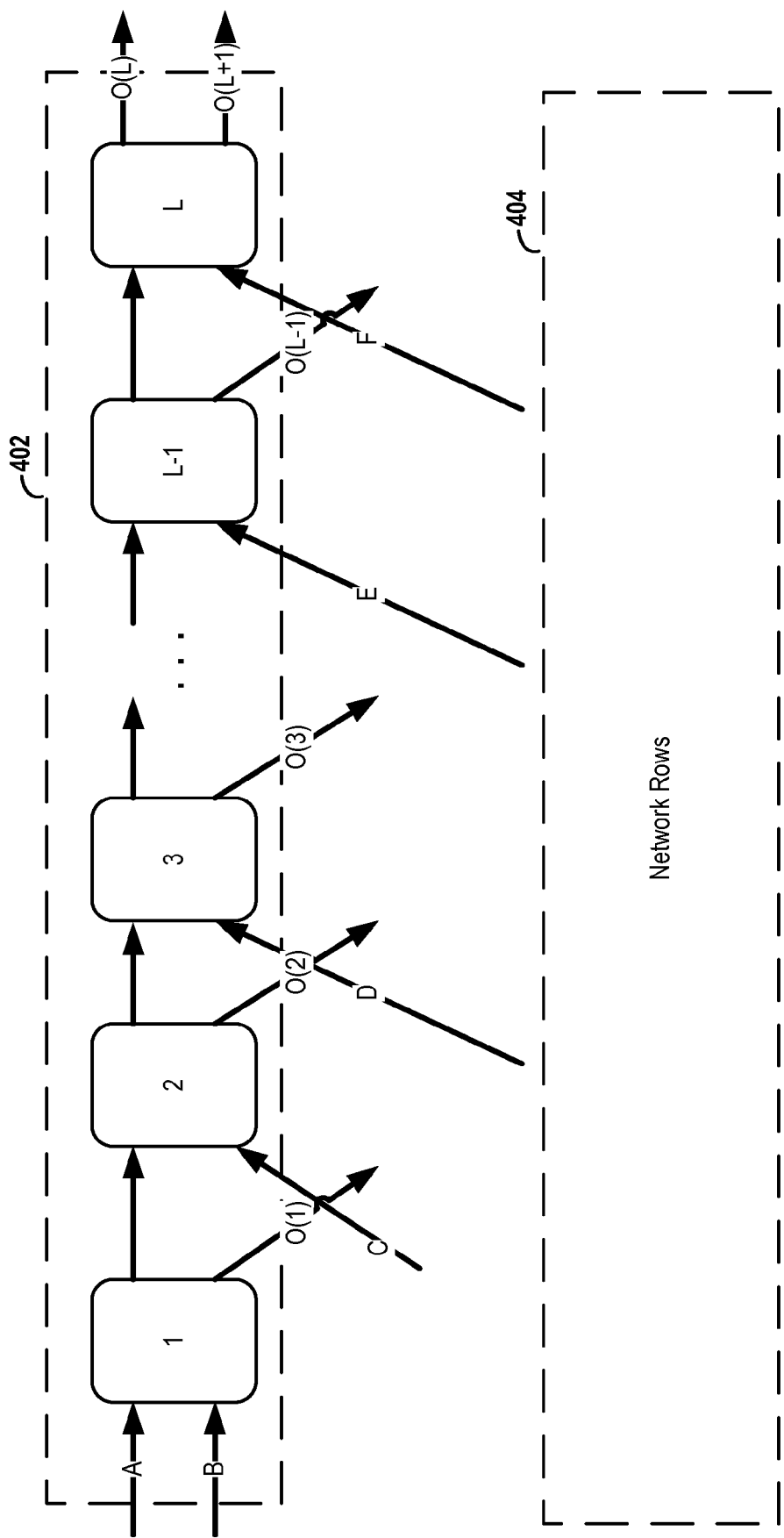
FIG. 4 depicts a logical diagram for a row of a Benes network.

FIG. 4 depicts a logical diagram for a row of a non-folded Benes network. In particular, FIG. 4 shows that the size of the Benes (or other) network is not limited to any particular size. The row 402 contains L stages, with the ellipses between rows 3 and L-2 representing an undetermined number of possible additional stages. Row 402 receives and sends data to other rows 404 in the network. Consistent with the discussion of FIGS. 1-3, each output from the row 402 can be implemented using a multiplexer that receives, as inputs, all possible signals that can be routed thereto. For example, the internal multiplexer for O1 would receive inputs A and B; the internal multiplexer for O2 would receive as inputs a, b and c, and the internal multiplexer for O(L-1) would receive as inputs A, B, C, D and E. The internal multiplexer for O4 would also include any additional inputs for corresponding additional stages between stage 3 and stage L-2. Thus, for a five stage network there are two 6:1 global multiplexers and four internal multiplexers ranging in size from 2:1 up to 5:1. As discussed herein, the various networks can be implemented for a number of different networks including strictly or rearrangeably non-blocking networks.

Particular implementations are directed toward implementations of networks within a programmable IC device. Modern programmable IC devices include a number of improvements/changes. Some of these improvements include lookup tables (LUTs) with six or more inputs, dedicated multiplexers, multiple-logic outputs, arithmetic support, hard logic for random access memory (RAM), dedicated flip flops, multiple LUTs per tile, swappable LUTs in a tile, I/O distributed in columns throughout the chip, unidirectional interconnection with switches implemented as multiplexers, Fc<<W (the percentage of inputs not connectable each outputs is relatively high) and Fs<3 (each wire in the switch block connects to less than 3 wires). In recognition of these changes, and other changes, embodiments of the present invention are particularly well-suited for implementation in a programmable IC device. Accordingly, specific embodiments are implemented for programmable IC devices having tiles with 8 or more LUTs, 16 or more inputs, 4 or more outputs and unidirectional wiring.

Figure 5:
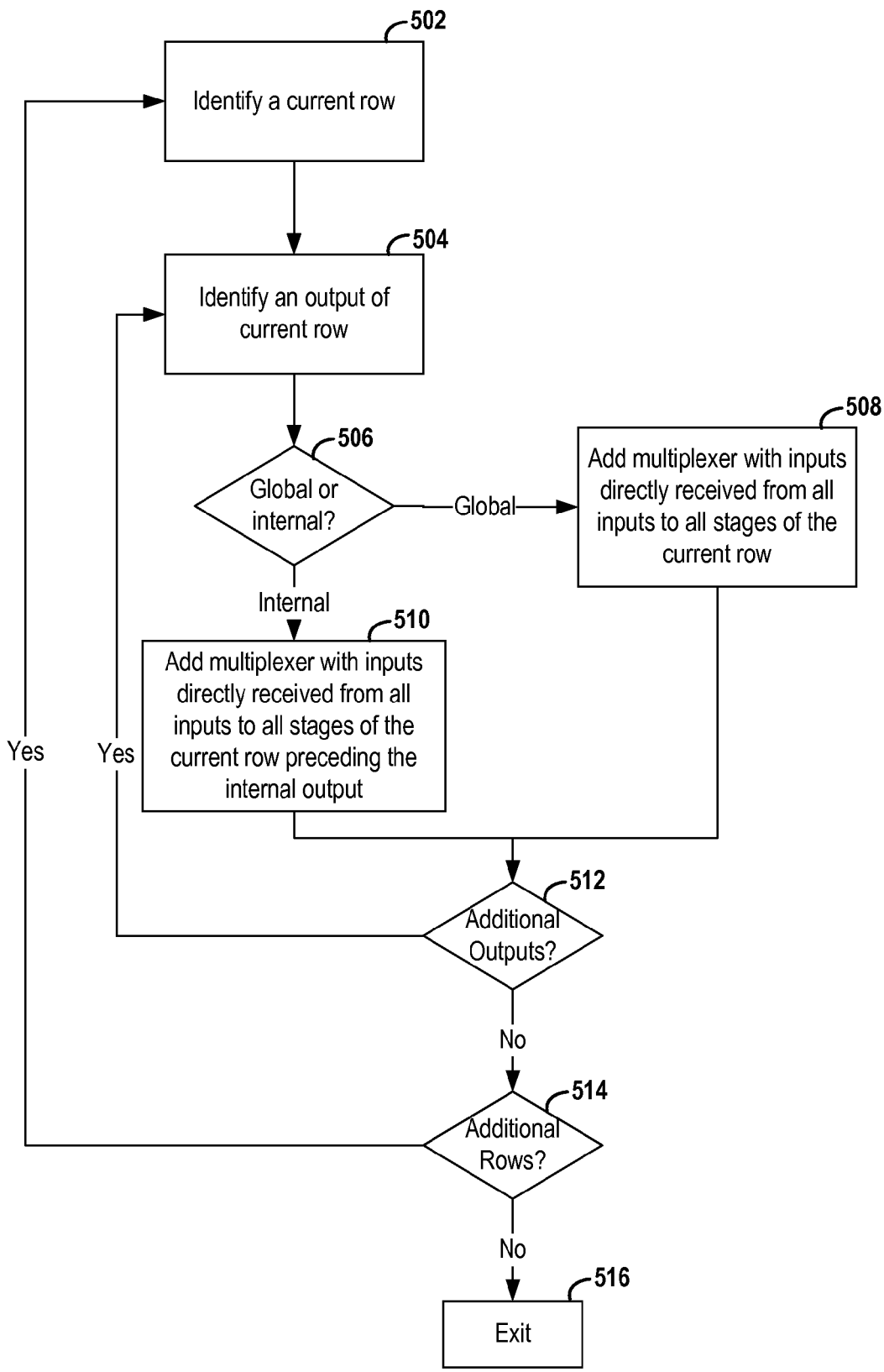
FIG. 5 depicts a flow diagram for designing a new multiplexer-based interconnection network from an existing interconnection network type.

FIG. 5 depicts a flow diagram for designing a new multiplexer-based interconnection network from an existing interconnection network type. The steps depicted in FIG. 5 can be used to modify an existing interconnection network to produce a new interconnection network that uses relatively wide multiplexers to provide low-latency signal paths. The steps can be applied to a variety of different network types including, but not limited to, a Benes network.

Step 502 includes the identification of a current row of the existing interconnection network. A row represents a set of switches that a signal traverses in order to be routed between an input and an output. This means that the signal can be passed from the input to output without leaving the row. Of course, each row can have multiple routing paths that enter and leave the row and a particular signal can be routed out of the row depending upon the particular routing solution and a signal passing from input to output in the same row might still leave the row.

After a current row is selected, an output of that row is selected at step 504. The selected output can be an internal output or a global output. In a particular implementation, the first output selected can represent an output for the first stage of the existing interconnection network. Subsequently selected outputs can be selected based upon outputs from sequentially selected stages.

Step 506 involves a determination as to whether the selected output is an internal output or a global output. If the output is an internal output, the process proceeds to step 510, and if the output is a global output, the process proceeds to step 508.

At step 510, a multiplexer is added to the new network. The multiplexer output provides an internal output that is routed to another row of the new network. The multiplexer is designed to accommodate all possible inputs to the row that can be routed to the selected output. In this manner, the configuration of the multiplexer can be implemented without knowledge of the other rows of the network. The resulting multiplexer is a N:1 multiplexer, where N=the total number of row inputs that can be routed to the selected output.

At step 508, a global multiplexer is added to the new network. The multiplexer output provides a global output that provides a signal to an external connection point of the new network. As in step 510, the multiplexer is designed to accommodate all possible inputs to the row that can be routed to the selected output. For a Benes type network, this includes all inputs to the row. Thus, the multiplexer is an M:1 multiplexer, where M=the total number of row inputs for the row.

At step 512 a determination is made as to whether or not there are any additional row outputs that have not yet been addressed by the method. If there are additional row outputs, the process selects a new row output and repeats. If there are not additional row outputs, the process proceeds to step 514.

At step 514 a determination is made as to whether or not there are any additional rows. If all rows have been addressed by the method, then the process exits at step 516. Otherwise, a new row is selected and the process repeats for the newly selected row.

Reasonable variations can be made to the process depicted in FIG. 5. For instance, various criteria can be used to determine that a wide multiplexer should not be provided for a particular output. In another instance, the width of a multiplexer can be limited to a maximum value. This maximum value can represent the limitations of the technology or be set based upon other criteria. The equivalent function can be implemented by smaller multiplexers arranged in combination.

The steps can be automated using a specially designed processor system. Instructions stored on a tangible storage medium can be accessed by a processor to implement the various steps. The processor can then store the output of the process, e.g., data representing the new interconnection network, on a tangible storage medium. This stored data can then be accessed and used to produce a circuit corresponding to the new interconnection network.

Figure 6:
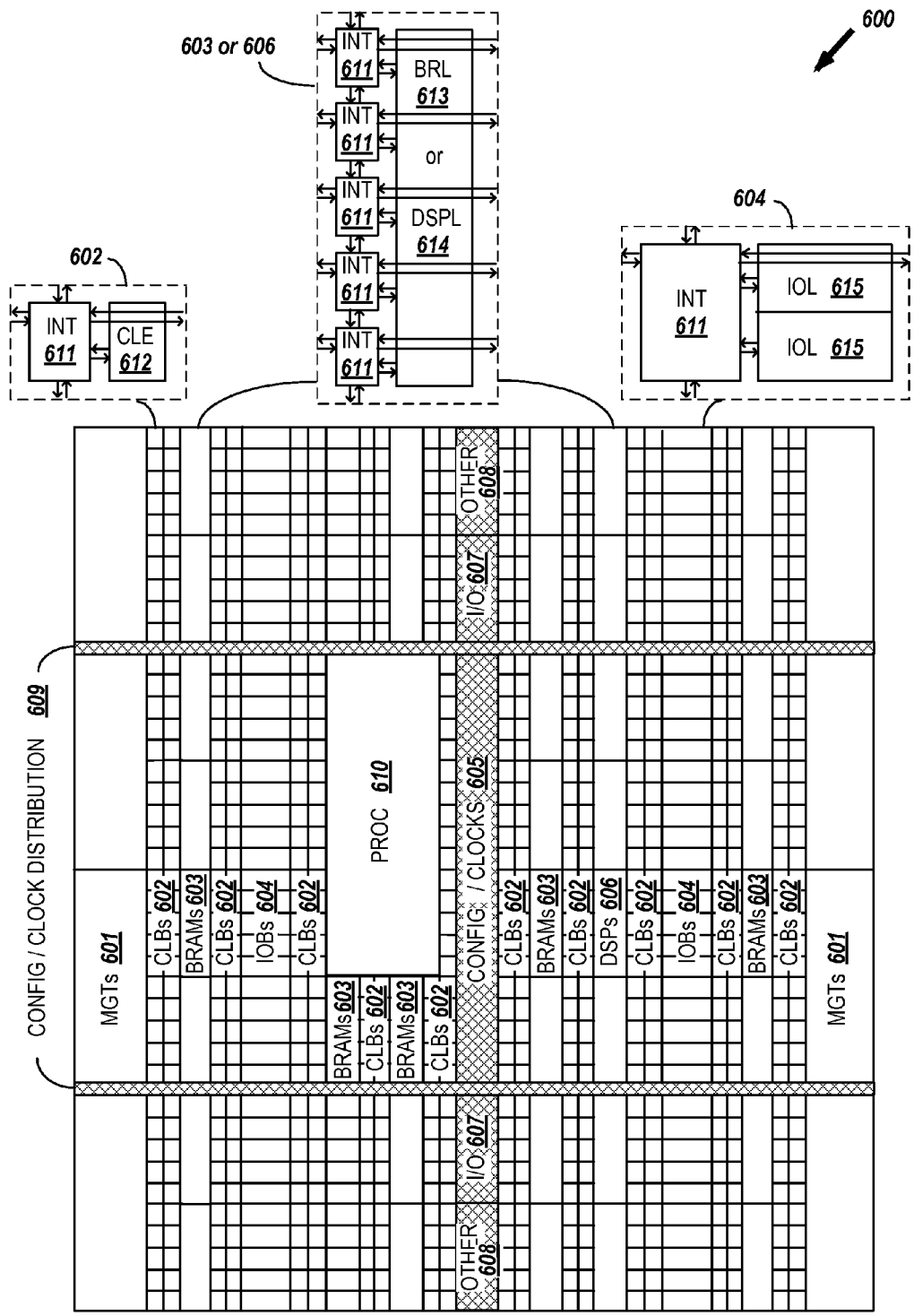
FIG. 6 is a block diagram view of a programmable integrated circuit.

FIG. 6 is a block diagram view of a programmable integrated circuit that can be used, for example, to implement the various embodiments described herein. The exemplary integrated circuit is an FPGA that includes a programmable interconnect element (INT 611) switching fabric for routing signals between tiles. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6. Collectively, the interconnect elements can be configured according to the various embodiments discussed herein.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610). Configuration information and clocks can be distributed using config/clock distribution 609.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Often, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

Figure 7:
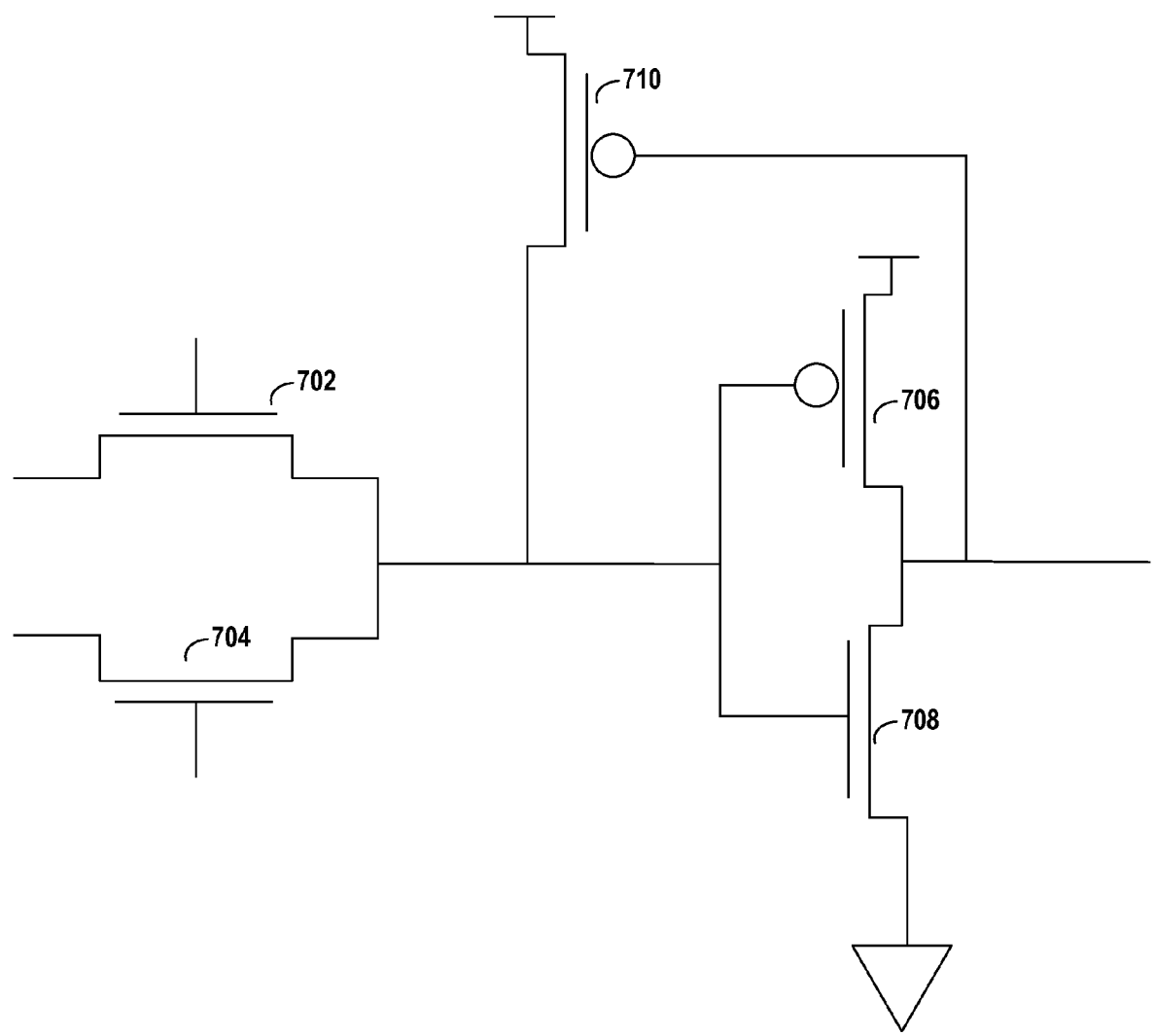
FIG. 7 depicts a circuit diagram for a multiplexer.

FIG. 7 depicts a circuit diagram for a multiplexer. The specific circuit diagram of FIG. 7 depicts a 2:1 multiplexer; however, larger multiplexers are possible and even preferred. The multiplexer of FIG. 7 can be used as part of the interconnection networks discussed herein. FETs 702 and 704 are input FETs that the selection between two different inputs depending upon a control signal. FETs 706 and 708 operate as a buffer for the selected input. FET 710 provides a pull-up function to the signal coupling the input FETs 702/704 and buffer FETs 706 and 708. The basic functionality for this 2:1 multiplexer can be used to construct larger multiplexers (e.g., 4:1, 8:1 or larger), as desired by, for instance, adding additional FETs coupled as FET 702 and FET 704 are coupled.

The specific circuit of FIG. 7 represents one possible implementation that can be used in connection with the interconnection networks discussed herein, and various other multiplexer circuits could be employed without limitation.

The present invention is thought to be applicable to a variety of interconnection networks. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims and equivalents thereof.

What is claimed is:

1. A non-blocking interconnection network, comprising:
   a plurality of global inputs;
   a plurality of global outputs; and
   a plurality of routing circuits collectively coupling the plurality of global inputs to the plurality of global outputs in a non-blocking manner,
   wherein each routing circuit includes:
   a first multiplexer including a first set of inputs and a first internal output, the first set of inputs coupled to two global inputs of the plurality of global inputs, the first multiplexer configured to provide a selected input of the first set of inputs to the first internal output in response to a first selection input,
   a second multiplexer including a second set of inputs and a second internal output, the second set of inputs coupled to the two global inputs of the plurality of global inputs and to a second internal output from a first other one of the routing circuits, the second multiplexer configured to provide a second selected input of the second set of inputs to the second internal output in response to a second selection input,
   a third multiplexer including a third set of inputs and a first global output, the third set of inputs coupled to the two global inputs of the plurality of global inputs, to the first internal output from the first other routing circuit, and to a second internal output from a second other one of the routing circuits, the third multiplexer configured to provide a third selected input of the third set of inputs to the first global output in response to a third selection input, and
   a fourth multiplexer coupled to the third set of inputs and including a second global output, the fourth multiplexer configured to provide a fourth selected input of the third set of inputs to the second global output in response to a fourth selection input.

2. The non-blocking interconnection network of claim 1, wherein:
   the interconnection network further includes additional routing circuits; and
   the inputs of the third set are coupled to a local output from each of the additional routing circuits.

3. The non-blocking interconnection network of claim 1, wherein:
   the interconnection network includes a plurality of rows, each row corresponding to a respective routing circuit; and
   the inputs of the third set are coupled to at least one local output from another of the plurality of rows.

4. The non-blocking interconnection network of claim 1, wherein:
   the interconnection network includes a plurality of rows, each row corresponding to a respective routing circuit and wherein the third set of inputs includes all inputs to the respective row.

5. The non-blocking interconnection network of claim 1, wherein the plurality of routing circuits collectively provide equivalent functionality to a Benes network.

6. The non-blocking interconnection network of claim 1, wherein:
   the non-blocking interconnection network is coupled to inputs and outputs of configurable logic blocks of a programmable integrated circuit; and
   the multiplexers for a particular row are co-located near a configurable logic block.

7. The non-blocking interconnection network of claim 1, wherein the non-blocking interconnection network is rearrangeably non-blocking.

* * * * *